United States Patent [19]
Shive et al.

[11] Patent Number: 5,919,311
[45] Date of Patent: Jul. 6, 1999

[54] CONTROL OF SIO$_2$ ETCH RATE USING DILUTE CHEMICAL ETCHANTS IN THE PRESENCE OF A MEGASONIC FIELD

[75] Inventors: Larry Wayne Shive, St. Peters, Mo.; Igor Jan Malik, Palo Alto, Calif.

[73] Assignee: MEMC Electronic Materials, Inc., St. Peters, Mo.

[21] Appl. No.: 08/749,906

[22] Filed: Nov. 15, 1996

[51] Int. Cl.$^6$ ............................... B08B 3/08; B08B 3/12
[52] U.S. Cl. ................... 134/1; 134/1.3; 134/2; 134/25.4; 134/26; 134/34; 216/99; 437/9; 437/225; 437/946; 437/974
[58] Field of Search ................ 216/99; 134/1, 134/1.3, 2, 25.4, 26, 34; 437/946, 974, 225, 9

[56] References Cited

U.S. PATENT DOCUMENTS

| | | | |
|---|---|---|---|
| 3,893,869 | 7/1975 | Mayer et al. | 134/86 |
| 4,804,007 | 2/1989 | Bran | 134/184 |
| 5,037,481 | 8/1991 | Bran | 134/1 |
| 5,279,316 | 1/1994 | Miranda | 134/102.1 |
| 5,286,657 | 2/1994 | Bran | 437/9 |
| 5,439,569 | 8/1995 | Carpio | 204/153.1 |
| 5,464,480 | 11/1995 | Matthews | 134/1.3 |
| 5,656,097 | 8/1997 | Olesen et al. | 134/1 |

OTHER PUBLICATIONS

Beyer et al. "Impact of Deionized Water Rinses on Silicon Surface Cleaning" J. Electrochem. Soc., vol. 129, No. 5, May 1982, pp. 1027–1029.

Vepa et al. "A Method for Native Oxide Thickness Measurement" 4th International Symposium on Cleaning Technology In Semi–conductor Device Manufacturing, Electrochemical Society Proceedings, vol. 95–20, pp. 358–365.

Meuris et al. "A New Cleaning Concept for Particle and Metal Removal on Si Surfaces" 3rd International Symposium on Cleaning Technology in Semiconductor Device Manufacturing, Electrochemical Society Proceedings, vol. 94–7, pp. 15–24.

Wang et al. "Megasonic Cleaner Characterization for VLSI Planarization Rie Post Clean Process" 3rd International Symposium on Cleaning Technology in Semiconductor Device Manufacturing, Electrochemical Society Proceedings, vol. 94–7, pp. 132–139.

*Primary Examiner*—Richard L. Raymond
*Attorney, Agent, or Firm*—Se3nniger, Powers, Leavitt & Roedel

[57] ABSTRACT

Processes for cleaning a silicon body and for controllably decreasing the thickness of a silicon dioxide layer overlying a silicon substrate are disclosed. The processes comprise chemically etching a silicon dioxide layer with a dilute etchant in the presence of a megasonic field. The concentration of the etchant is preferably less than its diffusion-rate-limiting threshold concentration at a given temperature. When aqueous alkaline hydroxyl ion etchants are employed, the concentration of etchant is preferably less than about 300 ppm by weight relative to water. The etching is discontinued before the silicon substrate is exposed to the etchant. The etch rate is controlled to within about $2\times10^{-5}$ $\mu$m/min (0.2 Å/min) of a target etch rate which ranges from about $3\times10^{-5}$ $\mu$m/min (0.3 Å/min) to about $4\times10^{-4}$ $\mu$m/min (4.0 Å/min). A simpler, more cost-effective chemical process for robustly cleaning silicon bodies or for producing very thin gate oxides is achieved.

30 Claims, 3 Drawing Sheets

CONTROL OF SIO₂ ETCH RATE USING DILUTE CHEMICAL ETCHANTS IN THE PRESENCE OF A MEGASONIC FIELD

BACKGROUND OF THE INVENTION

The present invention generally relates to the production of silicon bodies, and specifically, to a process for controllably etching silicon dioxide from the surface of such bodies. The invention particularly relates, in a preferred embodiment, to a process for cleaning the surface of single crystal silicon bodies, such as wafers.

Microelectronic semiconductor devices are typically fabricated on single crystal silicon wafers produced from single crystal ingots commercially grown by the well-known Czochralski method. The silicon wafers are typically prepared through a sequence of steps in which the ingot is trimmed to a precise diameter, flattened along one or more sides to identify crystallographic orientation, etched to remove mechanical defects, and then sliced along a specific orientation into unfinished wafers. The unfinished wafers are precisely shaped through further fabrication steps including edge-rounding, lapping, etching and polishing.

The yield and performance characteristics of a microelectronic device are significantly impacted by the level of surface contamination on the silicon wafers. Generally, both organic and metallic contaminants may become physically or chemically attached to the surface, usually due to the fabrication steps described above and the associated handling of the wafers. This concern has become more acute as device geometry has become increasingly smaller. Accordingly, the removal of such contamination is necessary between wafer fabrication and shaping steps, after polishing, and also during device fabrication processes.

A variety of chemical processes for cleaning contaminants from the surface of silicon bodies are known in the art. The "RCA method" is a well known commercial method for cleaning silicon wafers. In this method, the wafer is sequentially exposed to two different chemical solutions, typically referred to as "Standard Cleaning 1" (SC1) and "Standard Cleaning 2" (SC2) solutions. See F. Shimura, *Semiconductor Silicon Crystal Technology*, p.189, Academic Press (San Diego, Calif., 1989).

The SC1 solution consists of ammonium hydroxide, hydrogen peroxide and water in respective ratios ranging from about 1:2:7 to about 1:1:5 parts by volume of commercially available reagents, typically supplied as 28–30 wt % $NH_4OH$ in water and as 30–35 wt % $H_2O_2$ in water. The ratios of ammonium hydroxide and hydrogen peroxide are expressed relative to water, but independent of each other. That is, in the typical SC1 solution, the ratio of $NH_4OH$:$H_2O$ ranges from about 1:7 to about 1:5, the ratio of $H_2O_2$:$H_2O$ ranges from about 2:7 to about 1:5, and both of these ratios ($NH_4OH$:$H_2O$ and $H_2O_2$:$H_2O$) are independent of each other. Expressed in parts per million by weight relative to the amount of water, the concentration of $NH_4OH$ in SC1 typically ranges from about 35,000 ppm to 50,000 ppm. SC1 solutions with ratios of reagents of about 1:4:20 $NH_4OH$:$H_2O_2$:$H_2O$ (approximately 13,300 ppm $NH_4OH$) or of about 1:20:100 (approximately 2,800 ppm $NH_4OH$) are also known in the art. Meuris et al., *A New Cleaning Concept for Particle and Metal Removal on Si Surfaces*, Electrochem. Soc. Proc. Vol. 94-7, pp. 15–24 (1994).

The ammonium hydroxide and hydrogen peroxide in the SC1 solution simultaneously etch the silicon dioxide layer and oxidize the underlying silicon substrate, respectively. As it etches, the ammonium hydroxide removes organic contaminants and also complexes metallic contaminants such as copper, gold, nickel, cobalt and cadmium. However, an alkaline etchant, such as $NH_4OH$, would, if it came in contact with the underlying silicon substrate, etch the silicon in an anisotropic, crystal-orientation dependent manner and severely roughen the surface. The hydrogen peroxide in the SC1 solution prevents the ammonium hydroxide from etching the underlying silicon substrate. The rate of etching $SiO_2$ in the SC1 cleaning system is typically about 1–5 Å/min. However, etch rates of conventional SC1 solutions vary considerably with time, leading to non-uniform cleaning of silicon bodies. Additionally, the combination of the high basicity with high oxidation potential in the SC1 solution results in the precipitation of iron and aluminum oxides.

The second step of the RCA process, treatment with the SC2 solution, is primarily a remedial step aimed at the removal of the iron and aluminum oxides which arise during the SC1 step. The SC2 solution typically comprises hydrochloric acid, hydrogen peroxide and water in respective ratios ranging from 1:2:8 to 1:1:6 parts by volume of commercially available reagents, typically supplied as 28–30 wt % HCl in water and as 30–35 wt % $H_2O_2$ in water. The ratios of hydrogen chloride and hydrogen peroxide are expressed relative to water, but independently of each other. The SC2 solution forms soluble metallic complexes with alkali and transition metals.

Alternative approaches have been tried to avoid or reduce the problem of iron and aluminum precipitates. One approach was to use ultrapure reagents for the SC1 solution. However, even using reagents in which the concentration of iron and aluminum is less than 10 ppt, the SC2 step was required. Because most of the metallic impurities in the SC1 bath come from hydrogen peroxide, another approach was to use other oxidants, such as ozone, which are available without metallic impurities. However, attempts to replace the hydrogen peroxide with ozone were unsuccessful because ozone destroyed the ammonium hydroxide.

Improvements and variations of the RCA method are also known in the art. For example, complete removal of the naturally occurring silicon dioxide layer overlying the silicon substrate is believed to facilitate surface cleaning. To this end, brief etching of the silicon wafer in a very dilute, high-purity hydrofluoric acid (HF) solution may be employed between the SC1 and SC2 steps of the RCA method. Beyer and Kastl, *Impact of Deionized Water Rinses on Silicon Surface Cleaning*, J. Electrochem. Soc. 129, 1027–29 (1982). Another improvement relates to the use of megasonics with the SC1 and SC2 baths, as reported in U.S. Pat. No. 4,804,007 to Bran.

The use of megasonic cleaners for other, non-SC1 cleaning schemes is reported, for example, in U.S. Pat. No. 3,893,869 to Mayer et al., which discloses the use of megasonic frequency sound energy to facilitate loosening of particles on the surfaces of semiconductor wafers. Further advances in megasonic cleaning apparatus and applications have been made, as exemplified by U.S. Pat. Nos. 4,804,007 and 5,286,657 to Bran and U.S. Pat. No. 5,279,316 to Miranda relating to an improved megasonic transducer array, a high-intensity single-wafer system and a single-bath/multi-process system, respectively. Despite these improvements, the level of impurities and variation in etch rates associated with conventional SC1/SC2 silicon wafer cleaning systems remain problematic.

SUMMARY OF THE INVENTION

It is therefore an object of the present invention to provide a simpler, more cost-effective chemical process for robustly cleaning silicon bodies, and specifically, a process in which metallic-precipitate contaminants are not introduced by the cleaning reagents. An associated object of the invention is to improve the control over the rate at which silicon dioxide is etched, and preferably, to obtain a relatively low etch rate which is temporally uniform. A further object of the invention is to controllably etch silicon dioxide in order to reduce the thickness of the silicon dioxide layer without exposing the underlying silicon substrate to the etchant.

Briefly, therefore, the present invention is directed to a process for cleaning a silicon body having a silicon dioxide layer overlying a silicon substrate. The process comprises chemically etching the silicon dioxide layer with an etchant in the presence of a megasonic field at a temperature T, with the concentration of the etchant being less than its diffusion-rate-limiting threshold concentration at T. The etchant is preferably an aqueous alkaline etchant comprising hydroxyl ion, and the concentration of the etchant is preferably less than about 300 ppm by weight relative to water.

The process alternatively comprises chemically etching the silicon dioxide layer with an etchant at an etch rate controlled to be within about $2 \times 10^{-5}$ μm/min of a target etch rate, $R_{etch}$, the target etch rate, $R_{etch}$, ranging from about $3 \times 10^{-5}$ μm/min to about $4 \times 10^{-4}$ μm/min, discontinuing the etching before the silicon substrate is exposed to the etchant, and oxidizing the silicon substrate.

The present invention is also directed to a process for decreasing the thickness of a silicon dioxide layer overlying a silicon substrate. The process comprises chemically etching the silicon dioxide layer with an etchant at a temperature $T_1$ in the presence of a megasonic field with the concentration of the etchant being less than its diffusion-rate-limiting threshold concentration at $T_1$. The etchant is preferably an aqueous alkaline etchant comprising hydroxyl ion, and the concentration of the etchant is preferably less than about 300 ppm. The etching is discontinued before the silicon substrate is exposed to the etchant.

These methods for cleaning silicon bodies and for decreasing the thickness of a $SiO_2$ layer offer significant advantages over conventional methods. Uniform etch rates ranging from about $3 \times 10^{-5}$ μm/min (0.3 Å/min) to about $4 \times 10^{-4}$ μm/min (4.0 Å/min) can be achieved, and these etch rates can be controlled to within about $2 \times 10^{-5}$ μm/min (0.2 Å/min) of a target etch rate, $R_{etch}$. The achievement of controlled, uniform and low etch rates enables the use of caustic etchants such as $NH_4OH$ to etch the silicon dioxide layer without breaking through to the silicon substrate. Hence, an oxidizing agent, such as the SC1's $H_2O_2$ is not needed in the etching solution to preclude the etchant from anisotropically etching the silicon substrate. Further advantages result, in a preferred embodiment, from exposing the silicon body to the etchant and oxidant in two separate baths. The iron and aluminum oxide precipitates which are prevalent in the SC1 $NH_4OH/H_2O_2$ system are no longer of concern. The SC2 step may be eliminated because removal of the iron and aluminum oxides is not required. The intermediate HF step often employed between the SC1 and SC2 steps may also be eliminated. Another advantage of separating the etching and oxidation reactions is that other oxidants, such as ozone, which are incompatible with the $NH_4OH$ environment, can replace $H_2O_2$ and thereby eliminate a known contributor of impurities. Hence, it can be appreciated that the controlled, uniform and low etch rates achieved and applied in this invention result in substantial advances over conventional methods for cleaning the surface of silicon bodies.

Other features and objects of the present invention will be in part apparent to those skilled in the art and in part pointed out hereinafter.

DETAILED DESCRIPTION OF THE INVENTION

As used herein, the term "silicon" is intended to include within its scope both single crystal silicon and polycrystalline silicon. The term "etch rate" refers to the change in the thickness of a silicon dioxide layer per unit of time, where the thickness is measured as the distance perpendicular to the surface of the silicon dioxide substrate. The term "silicon body" refers to any configuration or shape of silicon which comprises a silicon dioxide layer overlying a silicon substrate. Although silicon wafers are exemplary of and included within the scope of the term "silicon body," the application of the invention is not limited to silicon wafers.

Figure 1:
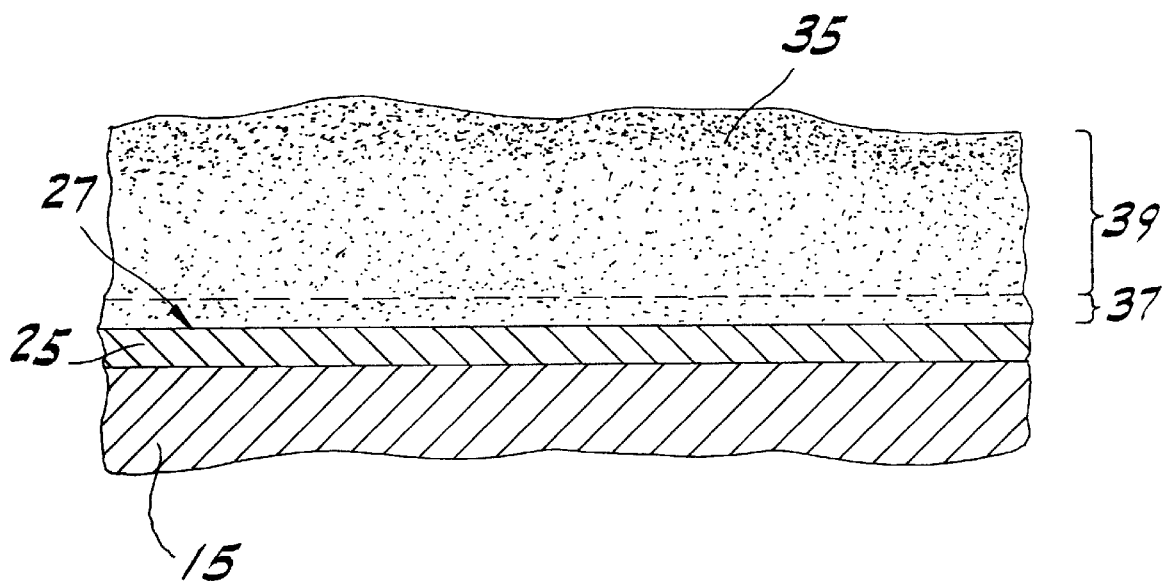
FIG. 1 shows a cut-away cross-sectional view of a silicon body immersed in an etchant.

Referring to FIG. 1, silicon dioxide is etched from a silicon dioxide layer 25 overlying a silicon substrate 15 comprising silicon at a reaction surface 27. The reaction surface 27 is defined by the interface between the silicon dioxide layer 25 and an etchant solution 35. As the etching reaction proceeds, the concentration of etchant at the reaction surface 27 becomes depleted, and a concentration boundary layer 37 forms within the solution 35 between the reaction surface 27 and the bulk solution 39. The etchant must diffuse through the concentration boundary layer 37 in order to react with the silicon dioxide at the reaction surface 27. The etch rate of the silicon dioxide layer 25 may be limited by either the rate of the etching reaction or the rate of diffusion of reactants to the reaction surface 27. If the etchant can diffuse through the concentration boundary layer 37 at a rate which is relatively faster than the rate at which the etchant is consumed in the etching reaction, there will be an excess of etchant at the reaction surface 27 and the etch rate will be limited by the rate of the etching reaction. However, if the diffusion of etchant from the bulk solution 39 to the reaction surface 27 cannot keep pace with the consumption of etchant at the reaction surface, then the etch rate will be limited by the rate of diffusion. The rate of diffusion is directly proportional to the concentration of etchant in the bulk solution 39. As used herein, a diffusion-rate-limiting threshold concentration of etchant in the bulk solution 39 is defined for a given temperature as that concentration above which the etch rate is limited by the rate of the etching reaction, and below which the etch rate is limited by diffusion of etchant to the reaction surface 27. If the etch rate is limited by the etching reaction rate, it is possible to control etch rate by the temperature of the solution 35 independent of the concentration of etchant. Conversely, if the etch rate is limited by diffusion, control of the etch rate is dependent upon temperature, upon the thickness of the concentration boundary layer 37 which defines the diffusion path length, and upon the concentration of etchant in the bulk solution 39.

According to the present invention, the silicon dioxide layer is chemically etched by an etchant in the presence of a megasonic field. Any chemical etchant may be used, including acidic and caustic etchants. Alkaline etchants comprising hydroxyl ions, such as ammonium hydroxide, tetramethyl hydroxide, potassium hydroxide or sodium hydroxide, are generally favored for many applications. An aqueous ammonium hydroxide solution is exemplary of the alkaline hydroxyl etchants, all of which substantially dissociate into hydroxyl ions under the conditions known and used in the art.

The megasonic field may be generated by methods known in the art, including for example, using single-tank or double-tank megasonic cleaning apparatus. The frequency of the megasonic field preferably ranges from about 700 kHz to about 1200 kHz, and most preferably from about 840 kHz to about 875 kHz. The power of the megasonic field which is applied to the silicon bodies being etched is not narrowly critical, but can generally range from about 2 W per body to about 30 W per body, and preferably ranges from about 5 W per body to about 10 W per body. Hence, the total power being supplied to a bath of twenty-five silicon wafers being etched preferably ranges from about 100 W to about 200 W, and most preferably about 150 W. However, the total power supplied to the megasonic transducer will generally need to be greater than the total power being applied to the bath in which the wafers are situated due to operational constraints, heat losses and other inefficiencies associated with the various megasonic cleaning apparatus. For example, the power supplied to a single-tank megasonic cleaning apparatus rated at 300 W is typically limited to about 90% of it's rated power—about 270 W. Assuming that heat heat losses and other inefficiencies associated with this type of apparatus further reduce the delivered power by a factor of about 20%, the power supplied to the etchant bath would be about 216 W and the megasonic power applied to twenty-five wafers in the bath would be about 9 W per wafer. The silicon body is preferably orientated in the etching bath in a manner which allows for accoustic streaming of the etchant over the dioxide layer being etched when megasonics is applied. When the silicon body is a silicon wafer, the wafers are preferably oriented in the etch-bath such that the surface of the wafer is in-line with (ie, parallel to) the direction in which the sound waves are transmitted through the etchant.

Figure 2:
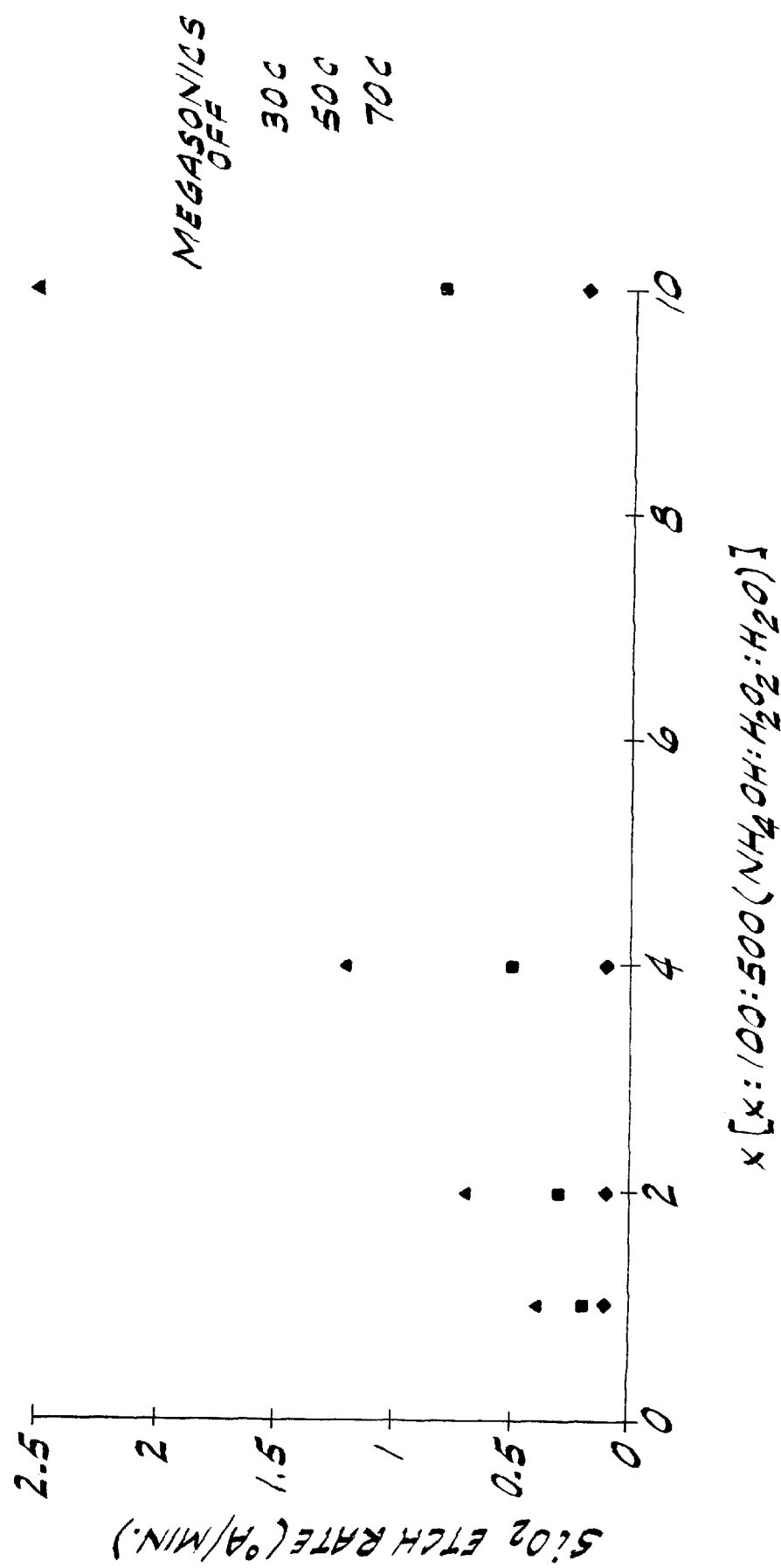
FIG. 2 shows $SiO_2$ etch rate versus $[NH_4OH]$ in the absence of a megasonic field with the $[NH_4OH]$ ranging from about 500 ppm to about 5000 ppm and temperature ranging from about 30° C. to about 70° C.
Figure 3:
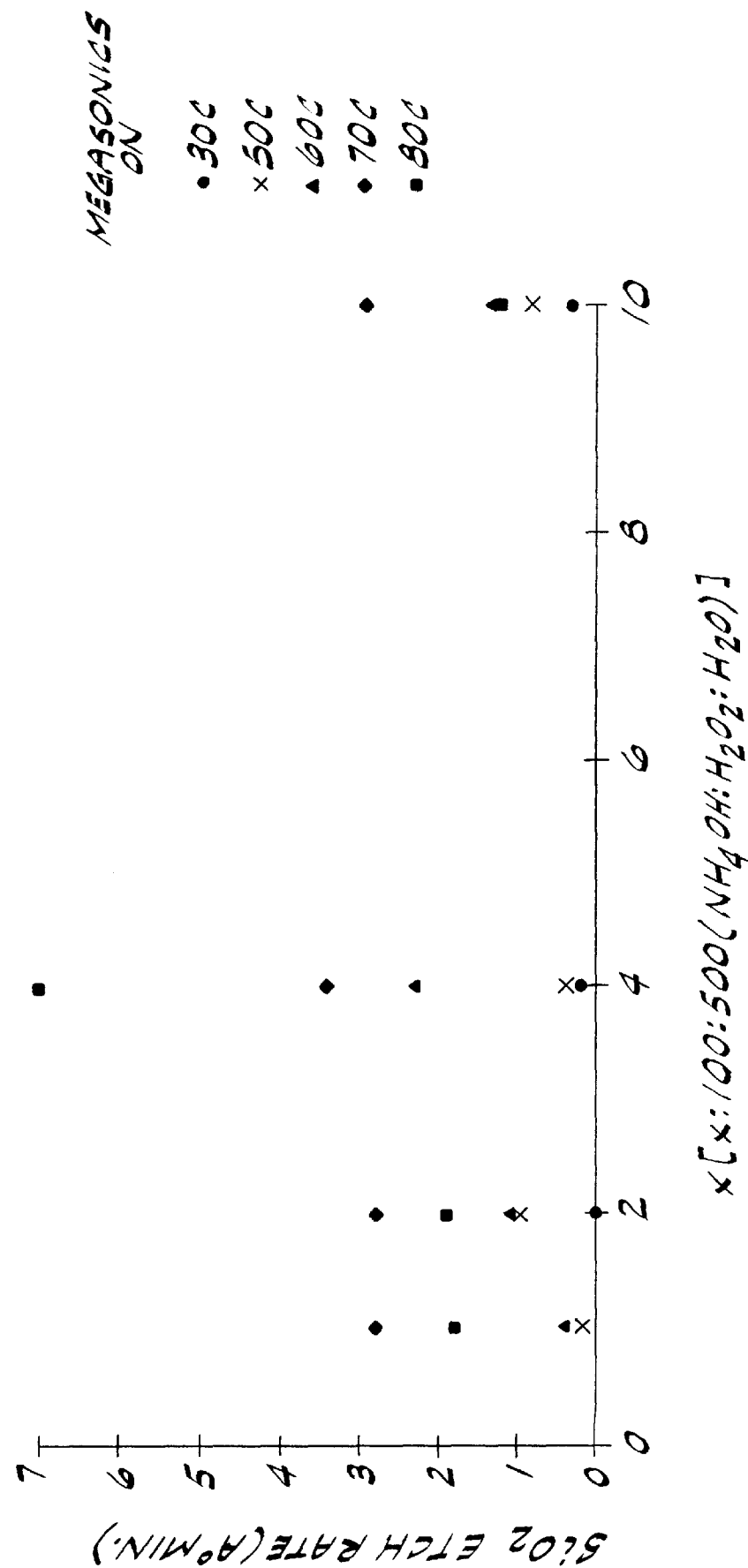
FIG. 3 shows $SiO_2$ etch rate versus $[NH_4OH]$ in the presence of a megasonic field with the $[NH_4OH]$ ranging from about 500 ppm to about 5000 ppm and temperature ranging from about 30° C. to about 80° C.

Etching the silicon dioxide layer in the presence of a megasonic field substantially affects the manner and mechanism by which the etch-rate can be controlled. For example, FIGS. 2 and 3 show $SiO_2$ etch rate versus concentration of $NH_4OH$ over similar temperature and concentration ranges with megasonics off and on, respectively. With megasonics off (FIG. 2), the etch rate is dependent upon the concentration of $NH_4OH$ and is under diffusion control. With megasonics on (FIG. 3), however, the etch rate is independent of the concentration of $NH_4OH$ and under reaction rate control. Without being bound by theory, the megasonic field appears to reduce the thickness of the concentration boundary layer 37 to create a shorter diffusion path length. More specifically, in a SC1 bath the thickness of the concentration boundary layer 37 ranges from about 50 to about 100 $\mu$m in the absence of a megasonic field, whereas the boundary layer thickness is about 1 $\mu$m in the presence of a megasonic field. As a result of the shorter diffusion path which exists in the presence of a megasonic field, the diffusion-rate-limiting threshold concentration of etchant in the bulk solution 39 is reduced relative to its value in the absence of a megasonic field. That is, when a megasonic field is applied, the silicon dioxide etch rate becomes diffusion limited (ie, transitions from being reaction rate limited) at comparatively lower bulk concentrations of etchant.

As such, lower concentrations of etchant can be used while still operating within the reaction-rate controlled regime. For example, with megasonics on, $SiO_2$ etch rates can be controlled independent of concentration using a dilute ammonium etchant at concentrations less than about 3000 ppm, but above the etchant's diffusion-rate-limiting threshold concentration for a particular temperature. Operating at such lower concentrations can be advantageous over prior art methods with respect to being less expensive and less corrosive. As shown in FIG. 3, etch rates ranging from less than $5 \times 10^{-5}$ $\mu$m/min (0.5 Å/min) to about $4 \times 10^{-4}$ $\mu$m/min (4 Å/min) are achievable using an ammonium hydroxide etchant at concentrations less than about 5,000 ppm over a temperature range of 30° C. to 80° C. Specifically, these etch rates were realized in an SC1 system in which the ratio of $NH_4OH:H_2O_2:H_2O$ ranges, respectively, from about 1:100:500 to about 1:10:50 by volume of commercially available reagent solutions, typically supplied as 28–30 wt % $NH_4OH$ in water and as 30–35 wt % $H_2O_2$ in water. The ratios of ammonium hydroxide and hydrogen peroxide are expressed relative to water, but independent of each other. That is, in the SC1 solution described above, the ratio of $NH_4OH:H_2O$ ranges from about 1:500 to about 1:50, the ratio of $H_2O_2:H_2O$ is about 1:5, and both of these ratios ($NH_4OH:H_2O$ and $H_2O_2:H_2O$) are independent of each other. Expressed in parts per million, the concentration of $NH_4OH$ in the SC1 solution described above ranges from about 550 ppm to about 5,500 ppm by weight relative to water. The etchant concentration while operating within the reaction-rate controlled regime using an aqueous alkaline etchant is preferably less than about 3000 ppm and more preferably less than about 1000 ppm by weight relative to water. Exemplary aqueous ammonium hydroxide etchant solutions would have ratios of $NH_4OH:H_2O$ of 1:100 (for about 3000 ppm) and of 1:300 (for 1000 ppm) by volume of commercially available reagents.

Moreover, the silicon dioxide layer can also be etched at acceptable rates in the presence of a megasonic field while operating within the diffusion-controlled regime, where the etchant concentration is less than the diffusion-limiting threshold concentration for the temperature at which the silicon dioxide is being etched. When alkaline hydroxyl ion etchants such as ammonium hydroxide are used in aqueous solution to etch silicon dioxide in the presence of a megasonic field, the etchant concentration is preferably less than about 300 ppm by weight relative to water and more preferably less than about 100 ppm for temperatures ranging from about 30° C. to about 80° C. The concentration of aqueous alkaline hydroxyl ion etchants preferably ranges from about 10 ppm to about 100 ppm and more preferably from about 30 ppm to about 100 ppm for temperatures ranging from about 30° C. to about 80° C. The concentration of such etchants most preferably ranges from about 50 ppm to about 80 ppm at a temperature of about 70° C. When a dilute ammonium hydroxide etchant is used at these preferred concentrations and temperatures, silicon dioxide etch rates ranging from about $3 \times 10^{-5}$ $\mu$m/min (0.3 Å/min) to about $4 \times 10^{-4}$ $\mu$m/min (4.0 Å/min) are achievable. Further, these etch rates are controllable to within about $2 \times 10^{-5}$ $\mu$m/min (0.2 Å/min) of a desired or target etch rate, $R_{etch}$. The use of such very dilute etchant solutions in conjunction with a megasonic system allows for relatively lower etch rates and a corresponding greater degree of control over the etching process. Using dilute etchants also results in less variation in concentration of etchant, and therefore, in more uniform etching. Collectively, the uniform, controllable and low etch rates provide an opportunity to discontinue the etching reaction in a precise and controllable manner.

Furthermore, dilute concentrations of etchant are substantially less expensive and less caustic.

Controlling the etch rate within values ranging from about $3 \times 10^{-5}$ μm/min (0.3 Å/min) to about $4 \times 10^{-4}$ μm/min (4.0 Å/min), and within about $2 \times 10^{-5}$ μm/min (0.2 Å/min) of the desired etch rate affords an opportunity to discontinue the etching reaction before the silicon substrate 15 is exposed to the etchant, and thereby precludes anisotropic etching of the silicon substrate 15. Controlling the etch rate within this range also allows for the possibility of etching up to as much as 0.1 μm (1000 Å) of silicon dioxide 25 within a reasonable time frame. Although the present invention could be used in applications where the thickness of the silicon dioxide layer 25 is to be decreased more than 0.1 μm, the invention is preferable suited to applications requiring a decrease of less than 0.1 μm, and most preferably decreases in thickness ranging from about $5 \times 10^{-4}$ μm (5 Å) to about $5 \times 10^{-3}$ μm (50 Å). Controlling the etch rate to within about $2 \times 10^{-5}$ μm/min (0.2 Å/min) of a desired etch rate further facilitates the controlled decrease in thickness of a silicon dioxide layer, as well as the controlled discontinuance of the etching before the silicon substrate is exposed to the etchant. The etch rate can be controllably discontinued when the thickness of the silicon dioxide layer is within about $5 \times 10^{-4}$ μm (5 Å) of a thickness, t, or equivalently, to within about one or two monolayers of silicon dioxide.

The achievement of such uniform and controllably low etch rates by the methods detailed above find direct application in cleaning impurities from the surface of silicon bodies. In a preferred embodiment, which constitutes a fundamental departure from the conventional SC1 step of the RCA method, alkaline etching and oxidizing of the silicon body occurs sequentially in separate baths. Specifically, the surface of a silicon body is cleaned by first chemically etching the silicon dioxide layer overlying the silicon substrate with an etchant in a first megasonic bath and in the absence of an oxidant. The surface of the silicon body is preferably hydrophilic before it is etched. If the surface is hydrophobic, it is preferable to expose the surface to an oxidant, such as ozone, prior to etching to achieve a surface which is hydrophilic in nature. The etching is preferably diffusion-rate limited rather than reaction-rate limited. In a preferred process, the etching is carried out in a megasonic bath with an etchant concentration less than the diffusion-limiting threshold concentration for the temperature at which the silicon dioxide is being etched. The silicon dioxide layer is preferably etched until the thickness of the silicon dioxide layer ranges from about 0.2 nm (2 Å) to about 1.0 nm (10 Å), but in any event, the etching is discontinued before the silicon substrate is exposed to the etchant. The etching results in an etched silicon body.

After rinsing the etched silicon body, by quick-dump-rinse or other techniques known in the art, the silicon substrate of the etched silicon body is oxidized with an oxidant in a second bath, preferably until the thickness of the silicon dioxide layer ranges from about 1.0 nm (10 Å) to about 1.5 nm (15 Å). Although any oxidant could be used, the oxidant preferably comprises ozone at concentrations ranging from about 50 ppb to about 50 ppm. Most preferably, the etched silicon body is exposed to a ozone at a concentration of about 15 ppm for about 5 minutes at room temperature. The oxidizing results in an oxidized silicon body. The oxidized silicon body is then rinsed, and preferably, the etching and oxidizing steps detailed above are repeated several times to ensure rigorous cleaning of the surface of the silicon body. The etch-rinse-oxidize-rinse cycle can be repeated as many times as necessary to effect cleaning of the silicon body surface. For cleaning single-crystal silicon wafers as a part of wafer or device manufacturing processes, two to six etching-oxidizing cycles are generally sufficient. After the final etching-oxidizing cycle, the oxidized silicon body is again rinsed, and then dried, preferably in an isopropyl alcohol vapor dryer.

The thickness of the silicon dioxide layer may be measured by several direct or indirect methods known in the art. Exemplary direct methods include ellipsometry and photoelectron spectrometry. In one indirect method, the time required to etch the silicon dioxide layer at a known etch rate is measured, and the average thickness is calculated therefrom. In an alternative indirect method, the entire silicon dioxide layer is etched from the substrate, and the silica content of the etchant solution is determined. Vepa et al., *A Method for Native Oxide Thickness Measurement*, Electrochem. Soc. Proc., Vol. 95-20, pp. 358–365 (1995).

A further embodiment of the present invention relates to an improvement in the SC1 cleaning step of the well known RCA method. In this embodiment, the surface of a silicon body is cleaned by chemically etching the silicon dioxide layer overlying the silicon substrate with an etchant in a megasonic bath which comprises a dilute concentration of etchant and an oxidant. As the silicon dioxide layer is etched, the oxidant in the bath simultaneously oxidizes the silicon substrate. In a system in which aqueous ammonium hydroxide and hydrogen peroxide are used as the etchant and oxidant, respectively, preferred concentrations of etchant ranging from about 10 ppm by weight relative to water to about 100 ppm are achieved using ratios of $NH_4OH:H_2O_2:H_2O$ ranging from about 1:100:28,000 to about 1:100:3000, respectively, by volume of commercially available reagent solutions, typically supplied as 28–30 wt % $NH_4OH$ in water and as 30–35 wt % $H_2O_2$ in water. That is, these preferred concentrations are achieved using an SC1 solution in which the ratio of $NH_4OH:H_2O$ ranges from about 1:28,000 to about 1:3000, the ratio of $H_2O_2:H_2O$ ranges from about 1:280 to about 1:30, and both of these ratios ($NH_4OH:H_2O$ and $H_2O_2:H_2O$) are independent of each other. Concentrations of etchant ranging from about 30 ppm by weight relative to water to about 100 ppm are achieved using ratios of $NH_4OH:H_2O_2:H_2O$ ranging from about 1:100:9,000 to about 1:100:3000, respectively, by volume of commercially available reagent solutions, typically supplied as 28–30 wt % $NH_4OH$ in water and as 30–35 wt % $H_2O_2$ in water. Following the SC1 step, the silicon body may be subsequently exposed to the SC2 solution in accordance with the known RCA method.

The present invention finds additional applications in the manufacture of gate oxides. Gate oxides are known in the art and are used in devices such as NMOS and PMOS field effect transistors (FET's). Gate oxides comprise a thin silicon dioxide layer overlying a silicon substrate. Typically, the thickness of the silicon dioxide layer on such thin gate oxides ranges from about $8 \times 10^{-3}$ μm (80 Å) to about $1 \times 10^{-2}$ μm (100 Å). Recent advances in gate oxide technologies require silicon dioxide layers ranging from about $4 \times 10^{-3}$ μm (40 Å) to about $5 \times 10^{-3}$ μm (50 Å). Further advances in technology for may ultimately require ultra thin silicon dioxide layers as thin as about $5 \times 10^{-4}$ (5 Å). Such ultra thin oxides may be achieved by the methods of this invention.

The embodiments described herein may be used in both multiple bath systems which employ a single process step in each bath, or in single bath systems which employ multiple process steps in that single bath. Further, the embodiments of the present invention could be employed as continuous processes or as batch processes acting on either multiple or individual silicon bodies.

Other applications for chemical etching systems with the characteristics of the present invention exist. In general, the invention may be used in any application in which it is desirable to remove a fixed amount of silicon dioxide, in a controlled manner, with or without reoxidizing the silicon substrate. Such other applications will be apparent to those skilled in the art.

What is claimed is:

1. A process for decreasing the thickness of a silicon dioxide layer overlying a silicon substrate, the process comprising
    chemically etching the silicon dioxide layer with an etchant in the presence of a megasonic field, the concentration of the etchant being less than the diffusion-rate-limiting threshold concentration for the temperature at which the silicon dioxide layer is being etched; and
    discontinuing the etching before the silicon substrate is exposed to the etchant.

2. The process as set forth in claim 1 wherein the etchant is an aqueous alkaline etchant comprising hydroxyl ion and the concentration of the etchant is less than about 300 ppm by weight relative to water.

3. The process as set forth in claim 2 wherein the concentration of the etchant is less than about 100 ppm.

4. The process as set forth in claim 2 wherein the etchant has a concentration ranging from about 30 ppm to about 100 ppm, and wherein the temperature of the etchant ranges from about 30° C. to about 80° C.

5. The process as set forth in claim 1 wherein the concentration of the etchant is sufficient to achieve an etch rate ranging from about $3 \times 10^{-5}$ $\mu$m/min to about $4 \times 10^{-4}$ $\mu$m/min for the temperature at which the silicon dioxide is being etched.

6. The process as set forth in claim 1 wherein the etch rate is controlled to be within about $2 \times 10^{-5}$ $\mu$m/min of a target etch rate.

7. The process as set forth in claim 1 wherein the etching is discontinued when the thickness of the silicon dioxide layer is within about $5 \times 10^{-4}$ $\mu$m of a target thickness.

8. A process for cleaning the surface of a silicon body having a silicon dioxide layer overlying a silicon substrate, the process comprising
    chemically etching the silicon dioxide layer with an etchant in the presence of a megasonic field to form an etched silicon body, the concentration of etchant being less than the diffusion-rate-limiting threshold concentration for the temperature at which the silicon dioxide layer is being etched;
    discontinuing the etching before the silicon substrate is exposed to the etchant; and
    oxidizing the silicon substrate with an oxidant to form an oxidized silicon body.

9. The process as set forth in claim 8 wherein the silicon dioxide layer is etched and the silicon substrate is oxidized in a bath comprising the etchant and the oxidant.

10. The process as set forth in claim 8 wherein the silicon dioxide layer is etched in a first bath comprising the etchant in the absence of an oxidant, and the silicon substrate is oxidized in a second bath comprising the oxidant.

11. The process as set forth in claim 10 wherein the steps of chemically etching the silicon dioxide layer, discontinuing the etching and oxidizing the silicon substrate are repeated at least once.

12. The process as set forth in claim 10 further comprising the steps of rinsing the etched silicon body and rinsing the oxidized silicon body.

13. The process as set forth in claim 10 wherein the silicon dioxide layer is etched until the thickness of the silicon dioxide layer ranges from about 0.2 nm to about 1.0 nm and the silicon substrate is oxidized until the thickness of the silicon dioxide layer ranges from about 1.0 nm to about 1.5 nm.

14. The process as set forth in claim 8 wherein the etchant is an aqueous alkaline etchant comprising hydroxyl ion and the concentration of etchant is less than about 300 ppm by weight relative to water.

15. The process as set forth in claim 14 wherein the concentration of the etchant is less than about 100 ppm.

16. The process as set forth in claim 14 wherein the etchant has a concentration ranging from about 30 ppm to about 100 ppm and the temperature of the etchant ranges from about 30° C. to about 80° C.

17. The process as set forth in claim 14 wherein the silicon dioxide layer is etched in a first bath comprising the etchant in the absence of an oxidant and the silicon substrate is oxidized in a second bath comprising the oxidant.

18. The process as set forth in claim 17 wherein the etchant comprises ammonium hydroxide at a concentration ranging from about 50 ppm to about 80 ppm, the temperature of the first bath is about 70° C., and the oxidant comprises ozone.

19. The process as set forth in claim 17 wherein the silicon dioxide layer is etched until the thickness of the silicon dioxide layer ranges from about 0.2 nm to about 1.0 nm and the silicon substrate is oxidized until the thickness of the silicon dioxide layer ranges from about 1.0 nm to about 1.5 nm.

20. The process as set forth in claim 17 further comprising the steps of: rinsing the etched silicon body; rinsing the oxidized silicon body; and repeating the steps of chemically etching the silicon dioxide layer, rinsing the etched silicon body, oxidizing the silicon substrate and rinsing the oxidized silicon body at least once.

21. A process for cleaning the surface of a silicon body having a silicon dioxide layer overlying a silicon substrate, the process comprising
    chemically etching the silicon dioxide layer with an etchant at an etch rate controlled to be within about $2 \times 10^{-5}$ $\mu$m/min of a target etch rate, the target etch rate ranging from about $3 \times 10^{-5}$ $\mu$m/min to about $4 \times 10^{-4}$ $\mu$m/min;
    discontinuing the etching before the silicon substrate is exposed to the etchant; and
    oxidizing the silicon substrate with an oxidant.

22. The process as set forth in claim 1 wherein the etchant is an alkaline etchant.

23. The process as set forth in claim 22 wherein the etchant is ammonium hydroxide.

24. The process as set forth in claim 8 wherein the etchant is an alkaline etchant.

25. The process as set forth in claim 24 wherein the etchant is ammonium hydroxide.

26. The process as set forth in claim 21 wherein the etchant is an alkaline etchant.

27. The process as set forth in claim 26 wherein the etchant is ammonium hydroxide.

28. A process for decreasing the thickness of a silicon dioxide layer overlying a silicon substrate, the process comprising:

chemically etching the silicon dioxide layer with an etchant in the presence of a megasonic field, the concentration of the etchant being less than about 300 ppm; and discontinuing the etching before the silicon substrate is exposed to the etchant.

29. The process as set forth in claim 28 wherein the etchant is an alkaline etchant.

30. The process as set forth in claim 28 wherein the etchant is ammonium hydroxide.

* * * * *